United States Patent
Park et al.

(10) Patent No.: US 11,625,119 B2
(45) Date of Patent: Apr. 11, 2023

(54) DISPLAY DEVICE INCLUDING AN INPUT SENSOR HAVING A CORNER AREA

(71) Applicant: SAMSUNG DISPLAY CO., LTD., Yongin-si (KR)

(72) Inventors: Youngwoo Park, Yongin-si (KR); Tae Hyun Kim, Seoul (KR); Yong-Hwan Park, Hwaseong-si (KR); Jonghyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/355,054

(22) Filed: Jun. 22, 2021

(65) Prior Publication Data

US 2022/0091718 A1    Mar. 24, 2022

(30) Foreign Application Priority Data

Sep. 24, 2020    (KR) .................. 10-2020-0123695

(51) Int. Cl.
  *G06F 3/041*    (2006.01)
  *H01L 27/32*    (2006.01)
  *G06F 3/044*    (2006.01)

(52) U.S. Cl.
  CPC ........ *G06F 3/04164* (2019.05); *G06F 3/0443* (2019.05); *G06F 3/0448* (2019.05); *H01L 27/323* (2013.01); *G06F 2203/04111* (2013.01)

(58) Field of Classification Search
  CPC ... G06F 3/04164; G06F 3/0448; G06F 3/0443
  See application file for complete search history.

(56) References Cited

U.S. PATENT DOCUMENTS

| | | | |
|---|---|---|---|
| 10,579,191 B2 | 3/2020 | Ko et al. | |
| 10,691,263 B2 | 6/2020 | Bok et al. | |
| 2017/0102872 A1* | 4/2017 | Kim | G06F 3/04886 |
| 2018/0173340 A1* | 6/2018 | Miyazaki | G06F 3/0412 |
| 2019/0004626 A1* | 1/2019 | Ko | G06F 3/0443 |
| 2021/0004126 A1* | 1/2021 | Jang | G06F 3/0443 |

FOREIGN PATENT DOCUMENTS

| | | |
|---|---|---|
| KR | 10-2016-0063540 | 6/2016 |
| KR | 10-2019-0001977 | 1/2019 |
| KR | 10-2020-0008679 | 1/2020 |

* cited by examiner

*Primary Examiner* — Chun-Nan Lin
(74) *Attorney, Agent, or Firm* — F. Chau & Associates, LLC

(57) ABSTRACT

A display device includes a window, a display panel disposed under the window, and an input sensor disposed between the window and the display panel and having a center area and a corner area disposed outside of the center area. The input sensor includes a first sensor part disposed in the center area and a second sensor part disposed in the corner area. The first sensor part includes first unit electrodes. The second sensor part includes a second unit electrode including a first part overlapping a first area and a second part extending from the first part and overlapping a first portion of a second area adjacent to the first area. A third unit electrode overlaps a second portion of the second area. The area of the second unit electrode is equal to or greater than the area of each of the first unit electrodes.

23 Claims, 16 Drawing Sheets

DISPLAY DEVICE INCLUDING AN INPUT SENSOR HAVING A CORNER AREA

CROSS-REFERENCE TO RELATED APPLICATIONS

This U.S. non-provisional patent application claims priority under 35 U.S.C. § 119 to Korean Patent Application No. 10-2020-0123695, filed on Sep. 24, 2020, the entire contents of which are hereby incorporated by reference.

TECHNICAL FIELD

The present disclosure relates to a display device, and more particularly, to a display device including an input sensor having a corner area.

DISCUSSION OF THE RELATED ART

A display device may include a display layer displaying an image and a sensor layer detecting an external input. The sensor layer may include a plurality of sensor units. It is becoming increasingly common for display devices to have shapes other than the flat rectangles and so both the display layers and the sensor layers are being formed in various different shapes. Some of these various shapes might result in some of the sensor units having a shape that is different From other sensor units of the same sensor layer.

SUMMARY

A display device includes a window, a display panel disposed under the window, and an input sensor disposed between the window and the display panel. The input sensor has a center area and a corner area disposed outside of the center area. The input sensor includes a first sensor part disposed in the center area and a second sensor part disposed in the corner area. The first sensor part includes a plurality of first unit electrodes. The second sensor part includes a second unit electrode including a first part overlapping a first area and a second part extending from the first part and overlapping a first portion of a second area adjacent to the first area, and a third unit electrode overlapping a second portion of the second area that is mutually exclusive with respect to the first portion of the second area. The area of the second unit electrode is equal to or greater than the area of each of the first unit electrodes.

In an embodiment, the first edge that is the edge of the first sensor part may have a linear shape, and the second edge that is the edge of the second sensor pan may have a curved shape.

In an embodiment, the second edge may include a first round edge included in the second unit electrode and a second round edge included in the third unit electrode, and a curvature of the second round edge is greater than that of the first round edge.

In an embodiment, each of the first unit electrodes may include a first detection electrode and a second detection electrode crossing the first detection electrode.

In an embodiment, the second unit electrode may include a first detection electrode and a second detection electrode crossing the first detection electrode.

In an embodiment, the first detection electrode may include a first detection pattern disposed on a single layer, and a first connection pattern connected to the first detection pattern. The second detection electrode may include a second detection pattern disposed on a single layer, and a second connection pattern disposed on a layer different from the first connection pattern and connected to the second detection pattern.

In an embodiment, the third unit electrode may include the first detection pattern and the second detection pattern.

In an embodiment, an area of the second unit electrode may be substantially equal to an area of each of the first unit electrodes.

In an embodiment, an area of the second unit electrode may be substantially 10 times greater than an area of the third unit electrode.

In an embodiment, an area of the second part may be substantially equal to an area of the third unit electrode.

In an embodiment, an area of the first part may be smaller than an area of each of the first unit electrodes.

In an embodiment, the second unit electrode may include a first detection electrode and a second detection electrode crossing the first detection electrode, and the third unit electrode includes a dummy electrode.

In an embodiment, an area of the second unit electrode may be larger than an area of each of the first unit electrodes.

In an embodiment, an area of the dummy electrode may be smaller than an area of the second part.

In an embodiment, the second unit electrodes may be provided in plural, and the third unit electrode may be disposed between each of the plurality of second unit electrodes.

A display device includes a window, a display panel disposed under the window, and an input sensor disposed between the window and the display panel, and having a center area and a corner area disposed outside the center area and including a plurality of first areas adjacent to the center area and a second area disposed between each of the plurality of first areas. The input sensor includes a first sensor part disposed in the center area and a second sensor part disposed in the corner area. The first sensor part includes a plurality of first unit electrodes. The second sensor part includes a second unit electrode overlapping a plurality of first areas adjacent to the center area and a second area defined between the first areas. An area of the second unit electrode is larger than an area of each of the first unit electrodes.

In an embodiment, the second unit electrode may be provided in plural, and each of the plurality of second unit electrodes may include a first part respectively disposed in each of the first areas and a second part partially extended from the first part to the second area. A detection electrode in the second area may extend beyond the second area.

In an embodiment, a first edge that is an edge of the first sensor part may have a linear shape, and a second edge that is an edge of the second sensor part may have a curved shape.

In an embodiment, each of the first unit electrodes and the second unit electrode may include a first detection electrode and a second detection electrode crossing the first detection electrode.

In an embodiment, areas of each of the plurality of second unit electrodes may be the same.

A display device includes a window, a display panel ha a straight central region and curved edges, and an input sensor disposed between the window and the display panel. The input sensor includes a first sensor part corresponding with the straight central region of the display panel and a second sensor part corresponding with the curved edges of the display panel. The first sensor part includes a plurality of rectangular first unit electrodes. The second sensor part includes a first-second unit electrode having at least one rounded corner, a second-second unit electrode having at least one rounded corner, and a third unit electrode having a wedge shape and disposed between the first-second unit electrode and the second-second unit electrode.

In an embodiment, an area of each of the first and second-second unit electrodes may be greater than or equal to an area of each of the first unit electrodes.

In an embodiment each of the first unit electrodes, each of the first and second-second unit electrodes, and the third unit electrode may include a first detection electrode and a second detection electrode crossing the first detection electrode.

In an embodiment, an area of the third unit electrode may be smaller than an area of each of the first unit electrodes and each of the first-second unit electrode and the second-second unit electrode.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
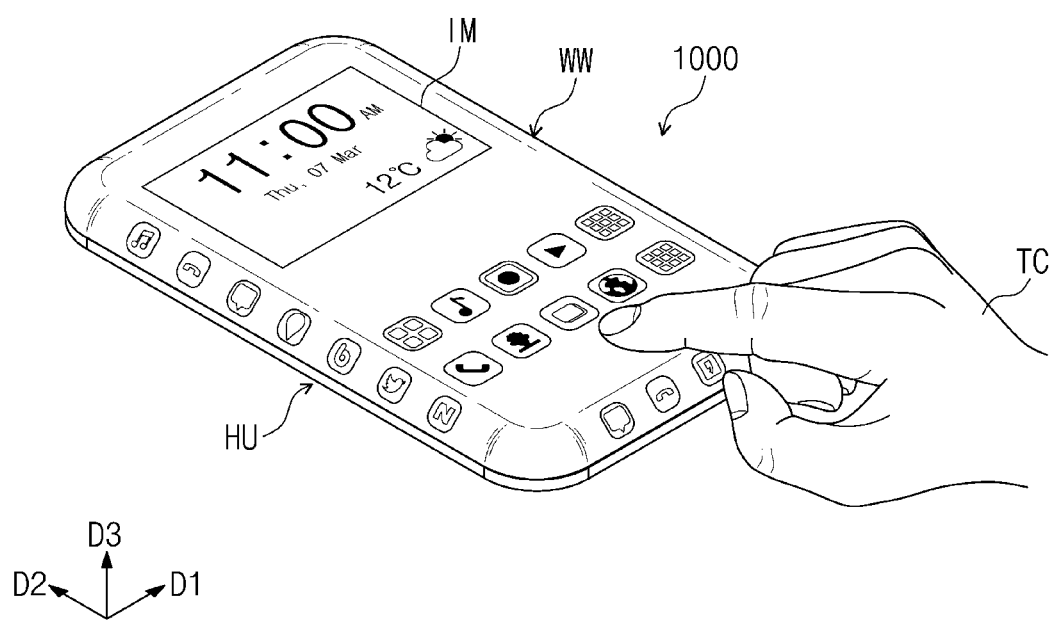
FIG. 1A is a perspective view illustrating a display device according to an embodiment of the inventive concept.

In this specification, when an element (or region, layer, part, etc.) is referred to as being "on", "connected to", or "coupled to" another element, it is to be understood that this relationship may be direct (e.g., without intervening elements disposed therebetween) or indirect with intervening elements disposed therebetween).

Like reference numerals may refer to like elements throughout the specification and drawings. Additionally, in the drawings, the thicknesses, proportions, and dimensions of components may be exaggerated for effective description. "And/or" includes all of one or more combinations defined by related components.

It will be understood that the terms "first" and "second" are used herein to describe various components but these components should not necessarily be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

Figure 1B:
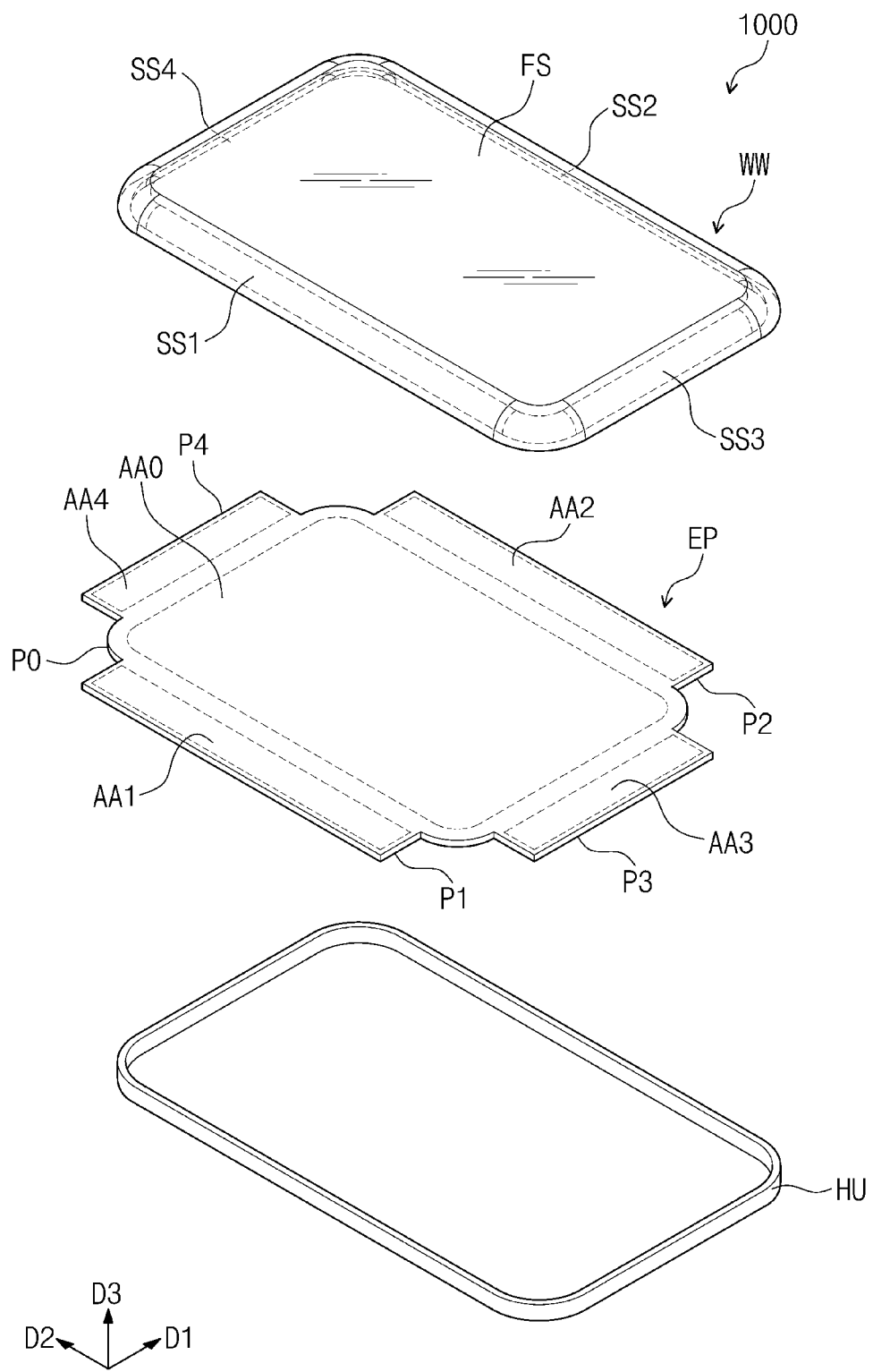
FIG. 1B is an exploded perspective view illustrating a display device according to an embodiment of the inventive concept.

FIG. 1A is a perspective view illustrating a display device according to an embodiment of the inventive concept. FIG. 1B is an exploded perspective view illustrating the display device illustrated in FIG. 1A.

The display device 1000 may be a device that is activated according to an electrical signal. For example, the display device 1000 may be a mobile phone, a tablet computer, a car navigation system, a game console, or a wearable device, but the present invention is not necessarily limited thereto. In FIG. 1A, the display device 1000 is illustrated as a mobile phone.

The display device 1000 may display an image IM and may detect an externally applied input, such as a user's touch input TC.

The image IM may be displayed on all sides of the window WW. For example, the image IM may be displayed on the front surface FS of the window WW and on each of the plurality of side surfaces SS1, SS2, SS3, and SS4. For example, the display device 1000, according to an embodiment of the inventive concept, may correspond to a so-called multi-faceted display device that displays an image on all of the front surface and the four side surfaces. In a multi-faceted display device, according to an embodiment of the inventive concept, the sensitivity of the corner area to detect a touch is maintained as the curvature of the corner area of the input sensor is reduced. Although the multi-faceted display device is shown in FIGS. 1A and 1B, present invention is not necessarily limited thereto, and may be applied to a front display device that displays an image exclusively from a front surface thereof. For example, according to an embodiment of the inventive concept, even in the input sensor of the front surface display device, the sensitivity to detect a touch in the corner area may be maintained so as to be at least as sensitive to the user's input TC as the center area.

The user's input TC (hereinafter referred to as external input) includes various types of external inputs such as part of the user's body, light, heat, or pressure. In addition, the display device 1000 may detect an input contacting the display device 1000 as well as an input that is close to or adjacent to the display device 1000. In this embodiment, the display device 1000 is shown as a smartphone, and the external input TC is shown as a user's hand. In this embodiment, the external input TC may include a force and a touch.

The display device 1000 may detect a user's input TC provided on all surfaces of the window WW. Although it is illustrated in FIG. 1A, that the user's input TC is provided on the front surface of the display device 1000 for easy description, the user's input IC may be provided to the side surfaces of the display device 1000, and the display device 1000 may easily detect position and intensity information of the external input TC provided to the side surfaces.

The display device 1000 may include a window WW, an electronic panel EP, and a housing unit HU. The window WW protects the upper surface of the electronic panel EP. The window WW may be optically transparent. Accordingly, the image displayed on the electronic panel EP may be visually recognized by the user through the window WW. The window WW may be made of glass, plastic, or a synthetic resin film.

The window WW may include at least a portion that is curved in a cross section defined by the first direction D1 and the second direction D2 curved away from the primary plane of the window WW). The window WW includes a front surface FS, a first side surface SS1, a second side surface S22, a third side surface SS3, and a fourth side surface SS4.

In this embodiment, the front surface FS is shown as occupying a plane that is perpendicular to the third direction D3. Each of the first side surface SS1, the second side surface S22, the third side surface SS3, and the fourth side surface SS4 is bent from the front surface FS. Each of the first side surface SS1 and the second side surface SS2 may be a surface bent from the front surface FS and perpendicular to the first direction D1. The first side surface SS1 and the second side surface S22 may face each other in the first direction D1.

Each of the third side surface SS3 and the fourth side surface SS4 may be a surface bent from the front surface FS and perpendicular to the second direction D2. The third side surface SS3 and the fourth side surface S24 may face each other in the second direction D2.

The electronic panel EP may include a main part P0 and a plurality of cutout parts P1, P2, P3, and P4. The main part P0 is disposed parallel to the front surface FS and may have a shape corresponding to the front surface FS. The main part P0 may include a main active area AA0 for providing an image IM to the front surface FS.

The cutout parts P1 P2 P3, and P4 may include first to fourth cutout parts P1, P2, P3, and P4. The first to fourth cutout parts P1, P2, P3, and P4 are disposed on the sides of the main part P0 and protrude from the main part P0, respectively.

Although it is shown in FIG. 1B that the first to fourth cutout parts P1, P2, P3, and P4 are parallel to the main part P0, this depiction is provided for easy explanation. The first to fourth cutout parts P1, P2, P3, and P4 may be assembled by bending from the main part P0 to face the first to fourth side surfaces SS1, SS2, SS3, SS4, respectively. The first to fourth cutout parts P1, P2, P3, and P4 may include sub-active areas AA1, AA2, AA3, and AA4 to provide image IM to each the first to fourth side surfaces SS1, SS2, SS3, and SS4.

The electronic panel EP may be assembled in various forms according to the shape of the window WW. For example, only some of the cutout parts P1, P2, P3, and P4 may be bent from the main part P0 and assembled, or all of the cutout parts P1, P2, P3, and P4 may be assembled into a shape defining the same plane as the main part P0. The display device 1000, according to an embodiment of the inventive concept, may be assembled in various forms according to a predetermined design, and the present invention is not necessarily limited to any one embodiment.

The display device 1000, according to an embodiment of the inventive concept, aims to provide adequate sensitivity to detect a touch in the corner area of the strain part P0 of the electronic panel EP. In this specification, hereinafter, the cutout parts P1, P2, P3, and P4 of the electronic panel EP are not separately described.

Figure 2:
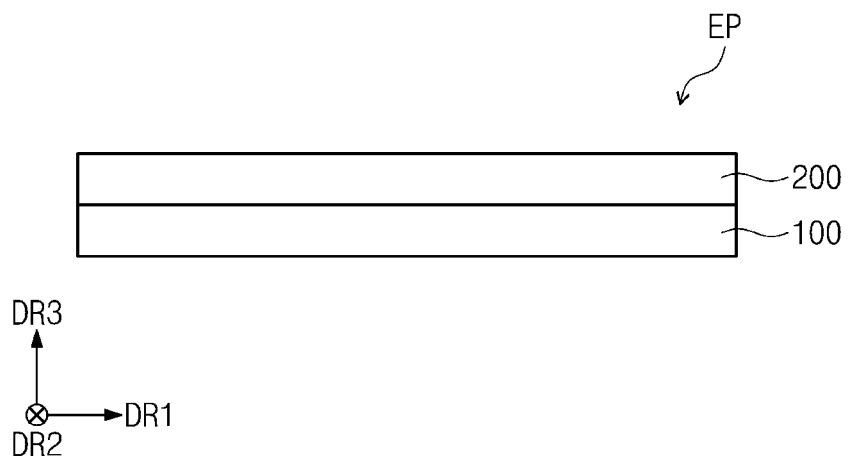
FIG. 2 is a cross-sectional view illustrating a partial configuration of a display device according to an embodiment of the inventive concept.

FIG. 2 is a cross-sectional view illustrating a configuration of an electronic panel according to an embodiment of the inventive concept.

Referring to FIG. 2, the electronic panel EP may include a display panel 100 and an input sensor 200.

The display panel 100 may be a component that generates an image. The display panel 100 may be a light emitting display panel. For example, the display panel 100 may be an organic light emitting display panel or a quantum dot light emitting display panel. Alternatively, the display panel 100 may be a light receiving display panel. For example, the display panel 100 may be a liquid crystal display panel that makes use of a backlight.

The input sensor 200 may be disposed on the display panel 100. The input sensor 200 may detect an external input. The external input may be a user's input. The user's input may include various types of external inputs such as an input from a part of the user's body, light, heat, pen, or force.

The input sensor 200 may be formed on the display panel 100 through a continuous process. Alternatively, the input sensors 200 may be coupled to each other through the display panel 100 and an adhesive member. The adhesive member may include a conventional adhesive or pressure-sensitive adhesive. For example, the adhesive member may be a transparent adhesive member such as a pressure sensitive adhesive film (PSA), an optically clear adhesive film (OCA), or an optically clear resin (OCR).

Figure 3:
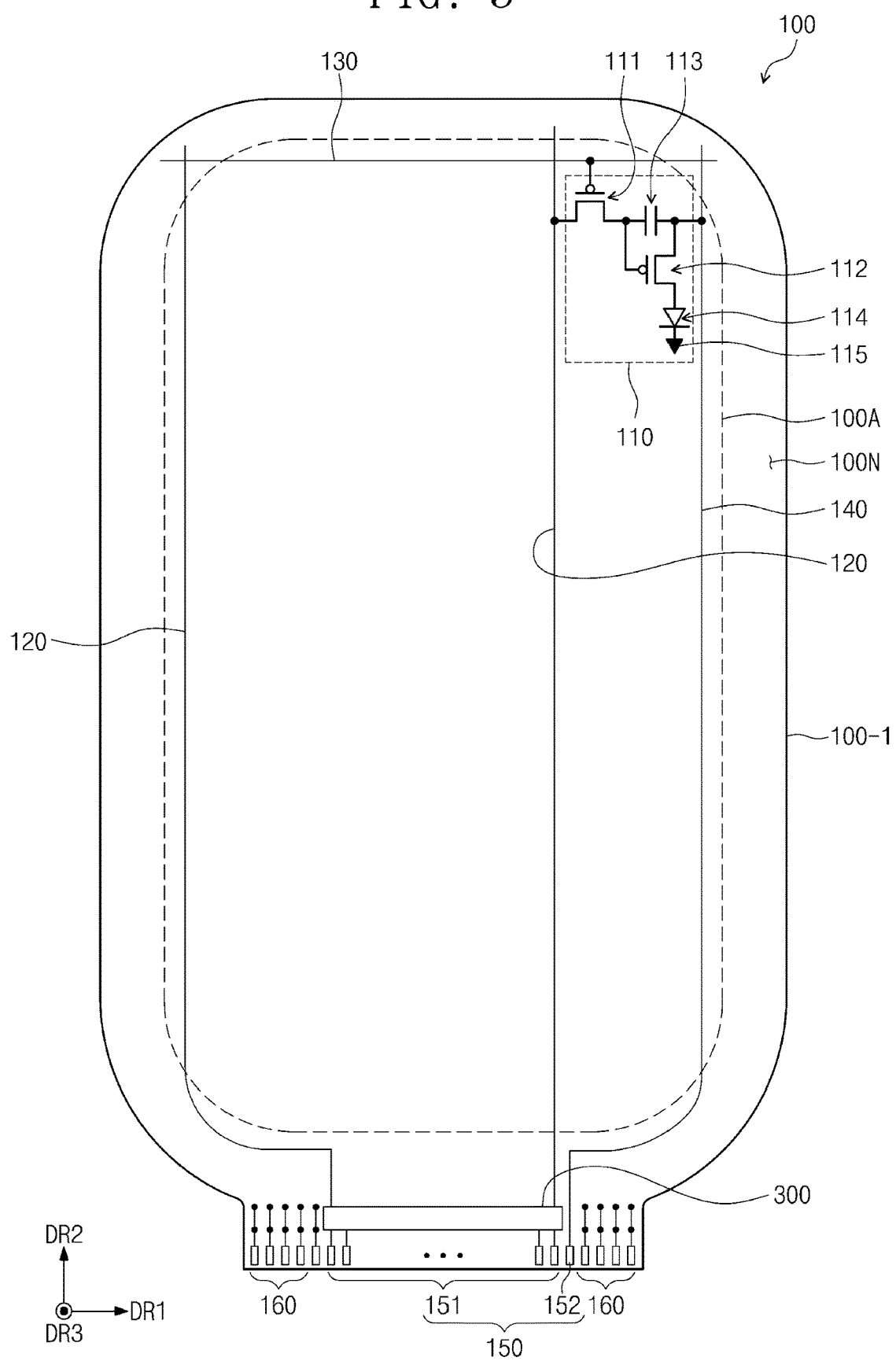
FIG. 3 is a plan view illustrating a display panel according to an embodiment of the inventive concept.

FIG. 3 is a plan view illustrating a display panel according to an embodiment of the inventive concept. The display panel illustrated in FIG. 3 corresponds to the main part P0 of the electronic panel EP.

Referring to FIG. 3, an active area 100A and a peripheral area 100N may be defined in the display panel 100. The active area 100A may be an area activated according to an electrical signal. For example, the active area 100A may be an area displaying an image. The peripheral area 100N may be disposed around the active area 100A. A driving circuit or a driving line for driving the active area 100A may be disposed within the peripheral area 100N.

A transmission area may be defined within the active area 100A of the display panel 100. The transmission area may be a space through which art external signal inputted to the electronic module or a signal outputted from the electronic module is transmitted. For example, the electronic module may be a camera module and the transmission area may be a notch or cutout.

The display panel 100 may include a base layer 100-1, a plurality of pixels 110, a plurality of signal lines 120, 130, and 140, a plurality of display pads 150, and a plurality of detection pads 160.

The base layer 100-1 may include a synthetic resin film. The synthetic resin film may include a thermosetting resin. The base layer 100-1 may have a multilayer structure. For example, the base layer 100-1 may have a three-layer structure of a synthetic resin layer, an adhesive layer, and a synthetic resin layer. Especially, the synthetic resin layer may be a polyimide resin layer, and the material thereof is not necessarily limited to the listed materials. The synthetic resin layer may include at least one of acrylic resin, methacrylic resin, polyisoprene, vinyl resin, epoxy resin, urethane resin, cellulose resin, siloxane resin, polyamide resin, and perylene resin. In addition, the base layer 100-1 may include a glass substrate or an organic/inorganic composite material substrate.

The signal lines 120, 130, and 140 are connected to the pixels 110 to transmit electrical signals to the pixels 110. In FIG. 3, it is illustrated that the signal lines 120, 130, and 140 include the data line 120, the scan line 130, and the power line 140. However, this is illustrated by way of example, and the signal lines 120, 130, and 140 may further include at least one of an initialization voltage line and an emission control line, and are not necessarily limited to any one embodiment.

The pixels 110 may be disposed in the active area 100A. In this embodiment, an equivalent circuit diagram of one pixel 110 among a plurality of pixels is enlarged and illustrated as an example.

The pixel 110 may include a first transistor 111, a second transistor 112, a capacitor 113, and a light emitting element 114. The first transistor 111 may be a switching element that turns the pixel 110 on and off. The first transistor 111 may transmit or block a data signal transmitted through the data line 120 in response to a scan signal transmitted through the scan line 130.

The capacitor 113 may be connected to the first transistor 111 and the power line 140. The capacitor 113 may provide an amount of charge corresponding to a difference between the data signal transmitted from the first transistor 111 and the first power signal applied to the power line 140.

The second transistor 112 may be connected to the first transistor 111, the capacitor 113, and the light emitting element 114. The second transistor 112 may control a driving current flowing through the light emitting element 114 in response to the amount of charge stored in the capacitor 113. The turn-on time of the second transistor 112 may be determined according to the amount of charge in the capacitor 113. The second transistor 112 may provide the first power signal transmitted through the power line 140 to the light emitting element 114 during the turn-on time.

The light emitting element 114 may generate light or control an amount of light according to an electrical signal. For example, the light emitting element 114 may include an organic light emitting element, a quantum dot light emitting element, a micro LED light emitting element, or a nano LED light emitting element.

The light emitting element 114 may be connected to the power terminal 115 to receive a power (hereinafter, referred to as a second power signal or a ground voltage) different from the first power signal provided by the power line 140. A driving current corresponding to the difference between the electric signal provided from the second transistor 112 and the second power signal flows through the light emitting element 114, and the light emitting element 114 may generate light corresponding to the driving current.

This is illustrated by way of example, and the pixel 110 may include electronic elements having various configurations and arrangements, and the pixel is not necessarily to any one embodiment. For example, the pixel 110 may have an equivalent circuit including seven transistors and one capacitor, and the equivalent circuit diagram of the pixel 110 may be modified in various forms.

The display pads 150 may include a first pad 151 and a second pad 152. A plurality of first pads 151 may be provided and may be respectively connected to the data lines 120. The second pad 152 may be electrically connected to the power line 140. The second pad 152 may be electrically connected to the power line 140 through a power pattern.

The display panel 100 may provide electrical signals provided from the outside through the display pads 150 to the pixels 110. The display pads 150 may further include pads for receiving electrical signals other than the first pad 151 and the second pad 152, and are not necessarily limited to any one embodiment.

The driving chip 300 may be mounted on the peripheral area 100N of the display panel 100. The driving chip 300 may be a timing control circuit in the form of a chip. In this case, the data lines 120 may be electrically connected to the first pads 151 through the driving chip 300. However, this is an example, and the driving chip 300 may be mounted on a separate film from the display panel 100. In this case, the driving chip 300 may be electrically connected to the display pads 150 through the film.

The plurality of detection pads 160 may be electrically connected to detection electrodes of a sensor to be described below. Some of the plurality of detection pads 160 and some other detection pads may be spaced apart from each other with the display pads 150 interposed therebetween. However, the inventive concept is not necessarily limited thereto, and an arrangement relationship between the detection pads 160 and the display pads 150 may be variously modified.

Figure 4:
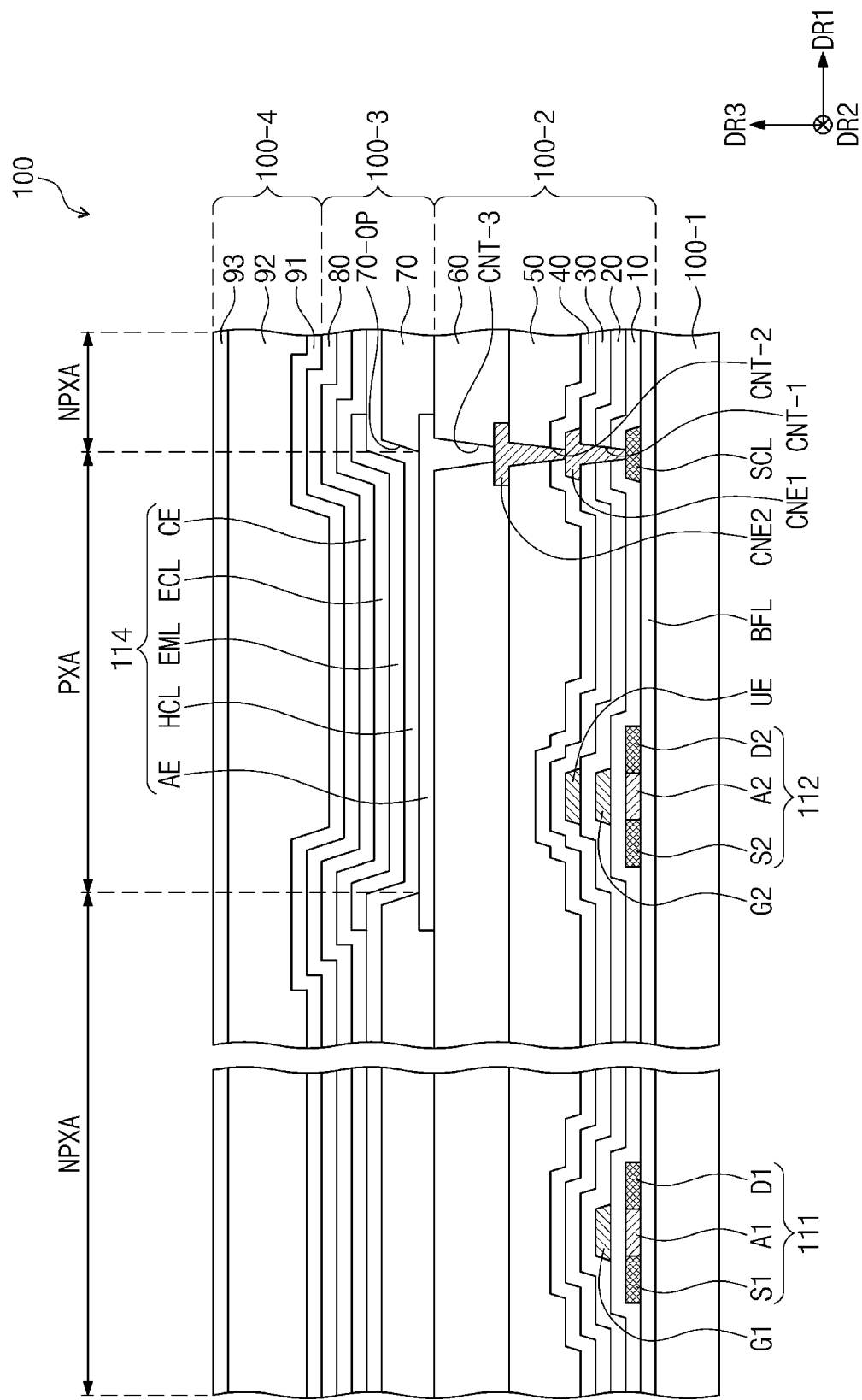
FIG. 4 is a cross-sectional view illustrating a display panel according to an embodiment of the inventive concept.

FIG. 4 is a cross-sectional view illustrating a display panel according to an embodiment of the inventive concept.

Referring to FIG. 4, the display panel 100 may include a plurality of insulating layers, a semiconductor pattern, a conductive pattern, and a signal line. An insulating layer, a semiconductor layer, and a conductive layer are formed by a method such as coating or vapor deposition. Thereafter, the insulating layer, the semiconductor layer, and the conductive layer may be selectively patterned by a photolithography method. In this way, semiconductor patterns, conductive patterns, and signal lines included in the circuit layer 100-2 and the display element layer 100-3 are formed. Thereafter, a sealing layer 100-4 covering the display element layer 100-3 may be formed.

At least one inorganic layer is formed on the upper surface of the base layer 100-1. The inorganic layer may include at least one of aluminum oxide, titanium oxide, silicon oxide silicon oxynitride, zirconium oxide, and hafnium oxide. The inorganic layer may be formed in multiple layers. The multi-layered inorganic layers may constitute a barrier layer and/or a buffer layer. In this embodiment, the display panel 100 is shown to include the buffer layer BFL.

The buffer layer BFL may increase bonding force between the base layer 100-1 and the semiconductor pattern. The buffer layer BFL may include a silicon oxide layer and a silicon nitride layer, and a silicon oxide layer and a silicon nitride layer may be alternately stacked.

A semiconductor pattern is disposed on the buffer layer BFL. The semiconductor pattern may include polysilicon. However, the inventive concept is not necessarily limited thereto, and the semiconductor pattern may include amorphous silicon or metal oxide.

FIG. 4 illustrates only some semiconductor patterns, and semiconductor patterns may be further disposed in other areas. The semiconductor pattern may be arranged in a specific manner over the pixels 110 (refer to FIG. 3). Semiconductor patterns may have different electrical properties depending on whether they are doped or not doped. The semiconductor pattern may include a doping area and a non-doping area. The doping area may be doped with an N-type dopant or a P-type dopant. The P-type transistor may include a doping area doped with a P-type dopant, and the N-type transistor may include a doping area doped with N-type dopant.

The doping area is more conductive than the non-doping area, and may substantially serve as an electrode or a signal line. The non-doping area may substantially correspond to the active (or channel) of the transistor. For example, a part of the semiconductor pattern may be an active part of the transistor, another part may be a source or drain of the transistor, and still another part may be a connection electrode or a connection signal line.

As shown in FIG. 4, the source S1, the active A1, and the drain D1 of the first transistor 111 may be formed from a semiconductor pattern, and the source S2, the active A2, and the drain D2 of the second transistor 112 may be formed from a semiconductor pattern. The sources S1 and S2 and the drains D1 and D2 may extend in opposite directions from the actives A1 and A2 on a cross section. FIG. 4 illustrates a part of a connection signal line SCL formed from a semiconductor pattern. The connection signal line SCL may be connected to the drain D2 of the second transistor 112 on a plane.

The first insulating layer may be disposed on the buffer layer BFL. The first insulating layer 10 may commonly overlap the plurality of pixels 110 (refer to FIG. 3) and cover a semiconductor pattern. The first insulating layer 10 may be an inorganic layer and/or an organic layer, and may have a single layer or multilayer structure. The first insulating layer 10 may include at least one of aluminum oxide, titanium oxide, silicon oxide silicon oxynitride, zirconium oxide, and hafnium oxide. In this embodiment, the first insulating layer 10 may be a single-layer silicon oxide layer. In addition to the first insulating layer 10, the insulating layer of the circuit layer 1002 to be described below may be an inorganic layer and/or an organic layer, and may have a single layer or multilayer structure. The inorganic layer may include at least one of the above-mentioned materials, but is not necessarily limited thereto.

The gates G1 and G2 are disposed on the first insulating layer 10. The gate G1 may be a part of the metal pattern. The gates G1 and G2 overlap the actives A1 and A2. In the process of doping the semiconductor pattern, the gates G1 and G2 may function as masks.

The second insulating layer 20 is disposed on the first insulating layer 10 and may cover the gates G1 and G2. The second insulating layer 20 may overlap the pixels 110 (see FIG. 3) in common. The second insulating layer 20 may be an inorganic layer and/or an organic layer, and may have a single layer or multilayer structure. In this embodiment, the second insulating layer 20 may be a single-layer silicon oxide layer.

The upper electrode UE may be disposed on the second insulating layer 20. The upper electrode UE may overlap the gate G2 of the second transistor 112. The upper electrode UE may be a part of the metal pattern. A portion of the gate G2 and the upper electrode UE overlapping therewith may define a capacitor 113 (refer to FIG. 3). In an embodiment of the inventive concept, the upper electrode UE may be omitted.

The third insulating layer 30 is disposed on the second insulating layer 20 and may cover the upper electrode UE. In this embodiment, the third insulating layer 30 may be a single-layer silicon oxide layer.

The first connection electrode CNE1 may be disposed on the third insulating layer 30. The first connection electrode CND may be connected to the connection signal line SCL through a contact hole CNT-1 penetrating the first to third insulating layers 10, 20, and 30.

The fourth insulating layer 40 may be disposed on the third insulating layer 30. The fourth insulating layer 40 may be a single layer of silicon oxide. The fifth insulating layer 50 may be disposed on the fourth insulating layer 40. The fifth insulating layer 50 may be an organic layer.

The second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

The sixth insulating layer 60 is disposed on the fifth insulating layer 50 and may cover the second connection electrode CNE2. The sixth insulating layer 60 may be an organic layer.

The display element layer 100-3 including the light emitting element 114 may be disposed on the circuit layer 100-2. The light emitting elements 114 may include a first electrode AE, a hole control layer HCL, a light emitting layer EML, an electronic control layer ECL, and a second electrode CE.

The first electrode AE may be disposed on the sixth insulating layer 60. The first electrode AE may be connected to the second connection electrode CNE2 through a contact hole CNT-3 penetrating, the sixth insulating layer 60.

The pixel defining film 70 is disposed on the sixth insulating layer 60 and may cover a portion of the first electrode AE. An opening part 70-OP is defined in the pixel defining film 70. The opening part 70-OP of the pixel defining film 70 exposes at least a portion of the first electrode AE.

As illustrated in FIG. 4, the active area 100A (refer to FIG. 3) may include a pixel area PXA and a non-pixel area NPXA adjacent to the pixel area PXA. The non-pixel area NPXA may enclose the pixel area PXA. In this embodiment, the pixel area PXA is defined to correspond to a partial area of the first electrode AE exposed by the opening part 70-OP.

The hole control layer HCL may be disposed on the first electrode AE. The hole control layer HCL may be commonly disposed in the pixel area PXA and the non-pixel area NPXA. The hole control layer HCL may include a hole transport layer, and may further include a hole injection layer.

The light emitting layer EMI, may be disposed on the hole control layer HCL. The light emitting layer EML may be disposed in an area corresponding to the opening part 70-OP. For example, the light emitting layer EVIL may be formed separately on each of the pixels 110 (see FIG. 3). However, the inventive concept is not necessarily limited thereto, and the light emitting layer EML may be commonly disposed in the pixel area PXA and the non-pixel area NPXA like the hole control layer HCL. When the light emitting layer EML is formed separately on each of the pixels, the light emitting layers EML may emit light of at least one color of blue, red, and green. When the light emitting layer EML is commonly disposed on the pixels 110 (see FIG. 3), the light emitting layer EML may provide blue light or white light.

The electronic control layer ECL may be disposed on the light emitting layer EML. The electronic control layer ECL may include an electron transport layer and may further include an electron injection layer. The hole control layer EWE and the electronic control layer ECL may be commonly formed in the plurality of pixels using an open mask.

The second electrode CE may be disposed on the electronic control layer ECL. The second electrode CE has an integral shape (e.g., being a single contiguous structure) and may be commonly disposed in the plurality of pixels 110 (refer to FIG. 3).

The capping layer 80 is disposed on the second electrode CE and may contact the second electrode CE. The capping layer 80 may include an organic material. The capping layer 80 may protect the second electrode CE from a subsequent process, such as a sputtering process, and may increase light emission efficiency of the light emitting element 114. The capping layer 80 may have a greater refractive index than the first inorganic layer 91 to be described below, but is not necessarily limited thereto. In an embodiment of the inventive concept, the capping layer 80 may be omitted.

The sealing layer 100-4 may be disposed on the display element layer 100-3. The sealing layer 100-4 may include a first inorganic layer 91, an organic layer 92 and a second inorganic layer 93. The first inorganic layer 91 and the second inorganic layer 93 protect the display element layer 100-3 from moisture/oxygen, and the organic layer 92 protects the display element layer 100-3 from foreign substances such as dust particles. The first inorganic layer 91 and the second inorganic layer 93 may include a silicon nitride layer, a silicon oxo nitride layer, a silicon oxide layer, a titanium oxide layer, an aluminum oxide layer, or the like. The organic layer 92 may include an acrylic organic layer, but is not necessarily limited thereto.

In an embodiment of the inventive concept, an inorganic layer such as a LiF layer may be further disposed between the capping layer 80 and the first inorganic layer 91. The LiF layer may increase light emission efficiency of the light emitting element 114.

Figure 5:
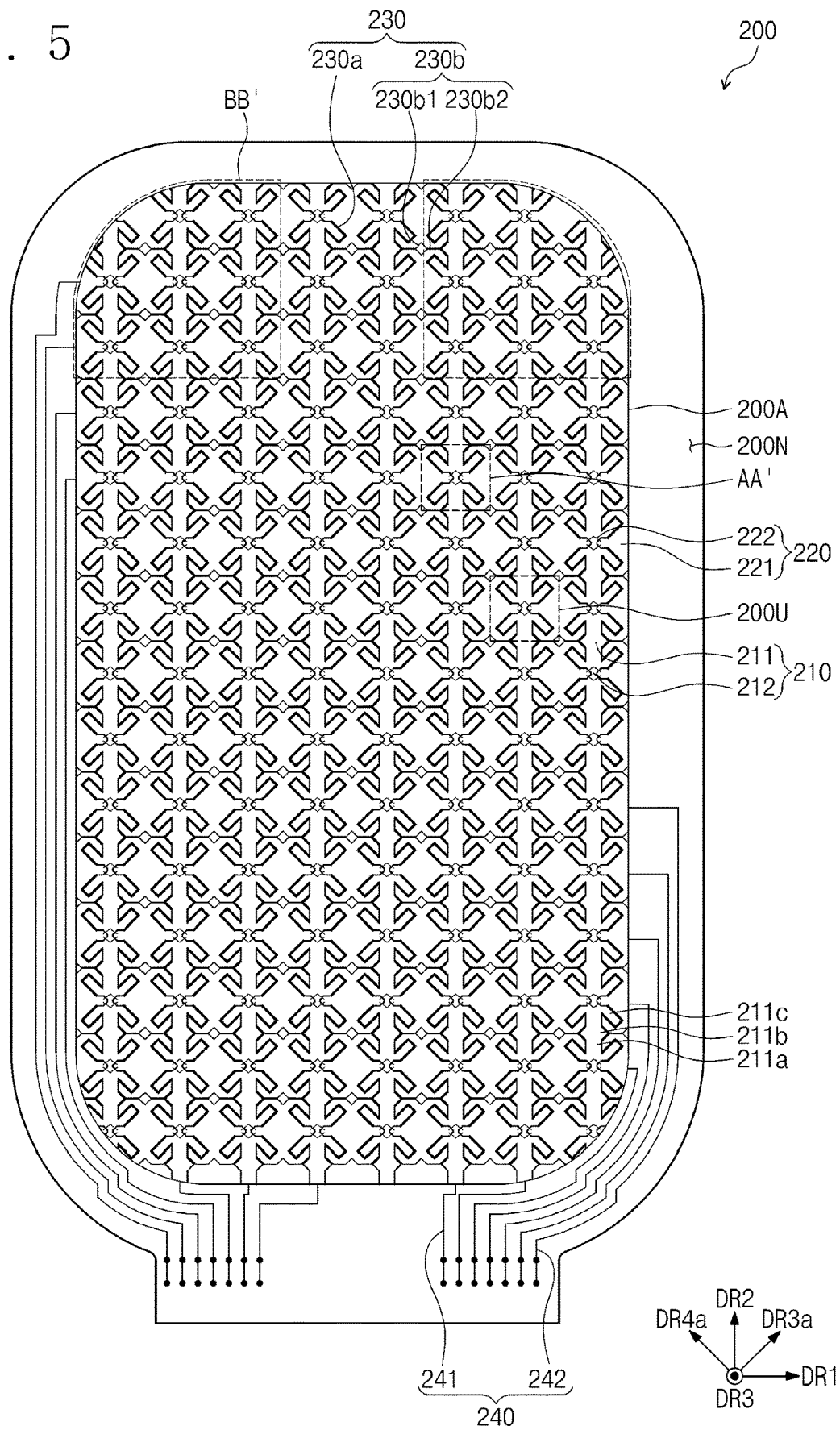
FIG. 5 is a plan view illustrating an input sensor according to an embodiment of the inventive concept.

FIG. 5 is a plan view illustrating an input sensor according to an embodiment of the inventive concept. FIG. 5 is a plan view illustrating an input sensor corresponding to the main part P0 of the electronic panel EP.

Referring to FIG. 5, an active area 200A and a peripheral area 200N may be defined in the input sensor 200. The active area 200A may be an area activated according to an electrical signal. For example, the active area 200A may be an area for detecting an input. The peripheral area 200N may enclose the active area 200A.

The input sensor 200 may include a base insulating layer 200-1, first detection electrodes 210, second detection electrodes 220, patterns 230, and a line part 240. The first detection electrodes 210, the second detection electrodes 220, and the patterns 230 may be disposed it the active area 200A, and the line part 240 may be disposed in the peripheral area 200N. The line part 240 may be electrically connected to a plurality of detection pads 160 (see FIG. 2) through a contact hole.

The input sensor 200 may obtain information on an external input through a change in mutual capacitance between the first detection electrodes 210 and the second detection electrodes 220. The first detection electrodes 210 may be arranged along a first direction DR1, and each of the first detection electrodes 210 may extend along a second direction DR2. The first detection electrodes 210 may include first detection patterns 211 and first connection patterns 212. The first connection patterns 212 may electrically connect two first detection patterns 211 that are adjacent to each other.

Each of the second detection electrodes 220 may extend along the first direction DR1, and the second detection electrodes 220 may be arranged along the second direction DR2. The second detection electrodes 220 may include second detection patterns 221 and second connection patterns 222. The second connection patterns 222 may electrically connect two second detection patterns 221 that are adjacent to each other. The two second detection patterns 221 that are adjacent to each other may be connected to each other by the two second connection patterns 222, but the inventive concept is not necessarily limited thereto.

Each of the first detection patterns 211 may include a first part 211*a*, a second part 211*b*, and a third part 211*c* that are all connected to each other.

The first part 211*a* may extend along the second direction DR2. One end of the first part 211*a* may be connected to one first connection pattern 212, and the other end of the first part 211*a* may be connected to another first connection pattern 212. The first part 211*a* may be referred to as a stem part. Since the first connection patterns 212 and the first detection patterns 211 have one connected structure, the first connection patterns 212 may be defined as part of the first part 211*a*.

The second part 211*b* may protrude from the first part 211*a* toward the first direction DR1. For example, the second part 211*b* may protrude in a direction away from the center area of the first part 211*a*.

The third part 211*c* may be provided in plurality. The third parts 211*c* may extend along the third direction DR3*a* or the fourth direction DR4*a* from the first part 211*a*. Some of the third parts 211*c* may extend along the third direction DR3*a*, and some of the third parts 211*c* may extend along the fourth direction DR4*a*. The third parts 211*c* may be referred to as branch parts.

The third direction DR3*a* may be a direction crossing the first direction DR1 and the second direction DR2. For example, the third direction DR3*a* may be a direction between the first direction DR1 and the second direction DR2. The fourth direction DR4*a* may be a direction crossing the third direction DR3*a*. For example, the third direction DR3*a* and the fourth direction DR4*a* may be orthogonal to each other.

Each of the second detection patterns 221 may have a shape corresponding to the shape of the adjacent first detection patterns 211. Each of the second detection patterns 221 may surround at least two third parts 211*c* of each of the adjacent first detection patterns 211.

The detection lines 241 and 242 may include first detection lines 244 and second detection lines 242. The first detection lines 241 may be electrically connected to the first detection electrodes 210, respectively. The second detection lines 242 may be electrically connected to the second detection electrodes 220, respectively. Some of the second detection lines 242 may be connected to the left sides of some of the second detection electrodes 220, respectively, and other some of the second detection lines 242 may be connected to the right sides of other some of the second detection electrodes 220, respectively. However, the connection relationship between the first detection lines 241 and the first detection electrodes 210 and the connection relationship between the second detection lines 242 and the second detection electrodes 220 are not necessarily limited to the example shown in FIG. 5.

The patterns 230 may be spaced apart from the first detection patterns 211 and the second detection patterns 221. The patterns 230 may be formed through the same process as the first detection patterns 211 and the second detection patterns 221. Accordingly, the patterns 230 may include the same material as the first detection patterns 211 and the second detection patterns 221 and may have the same stacked structure. The patterns 230 may be referred to as dummy patterns, auxiliary patterns, additional patterns, sub-patterns, or boundary patterns.

The patterns 230 may include a first pattern 230a and a second patient 230b, The first pattern 230a may be disposed between the first detection pattern 211 and the second detection pattern 221. The second pattern 230b may be disposed between the second detection patterns 221. For example, the second pattern 230b may be disposed between two second detection patterns 221 adjacent in the second direction DR2 to separate the two second detection patterns 221 from each other.

The second pattern 230b may include a first boundary pattern 230b1 and second boundary patterns 230b2. The first boundary pattern 230b1 may have a rhombic shape on a plane. The second boundary patterns 230b2 may be spaced apart from each other with the first boundary pattern 230b1 interposed therebetween. Each of the second boundary patterns 230b2 may extend along the first direction DR1. Each of the second boundary patterns 230b2 may be connected to the first boundary pattern 230b1 and the first pattern 230a.

As the first pattern 230a is disposed between the first detection patterns 211 and the second detection patterns 221 and the second pattern 230b is disposed between the second detection patterns 221, visibility of a boundary area between the first detection patterns 211 and the second detection patterns 221 and a boundary area between the second detection patterns 221 may be reduced.

Some of the patterns 230 are floating electrodes and might not be electrically connected to the first detection patterns 211 and the second detection patterns 221. Alternatively, some of the patterns 230 may be grounded. Other some of the patterns 230 may be connected to the first detection patterns 211 or the second detection patterns 221 to increase the sensitivity of the input sensor 200.

Figure 6:
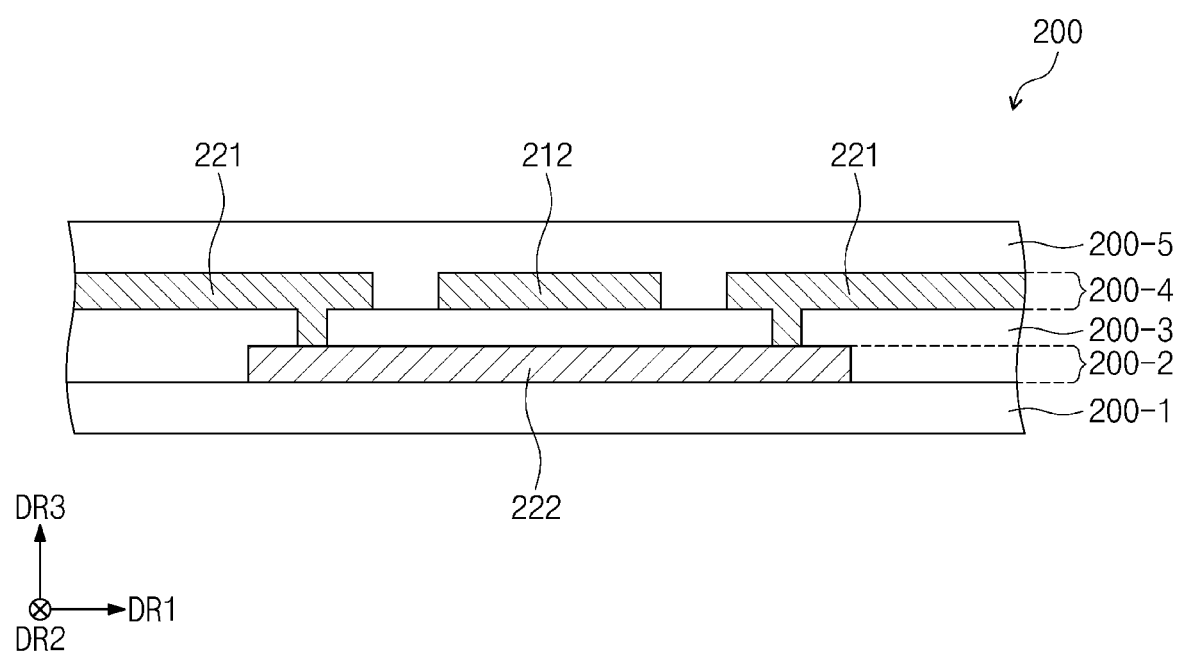
FIG. 6 is a cross-sectional view illustrating an input sensor according to an embodiment of the inventive concept.

FIG. 6 is a cross-sectional view of an input sensor according to an embodiment of the inventive concept.

Referring to FIGS. 5 and 6, in a cross-sectional view, the input sensor 200 includes a base insulating layer 200-1, a first conductive layer 200-2, a detection insulating layer 200-3, a second conductive layer 200-4, and a cover insulating layer 200-5. The first conductive layer 200-2 may be disposed on the base insulating layer 200-1. The detection insulating layer 200-3 may be disposed on the first conductive layer 200-2. The second conductive layer 200-4 may be disposed on the detection insulating layer 200-3. The cover insulating layer 200-5 may be disposed on the second conductive layer 200-4.

The base insulating layer 200-1 may be an inorganic layer including any one of silicon nitride, silicon oxynitride, and silicon oxide. Alternatively, the base insulating layer 200-1 may be an organic layer including an epoxy resin, an acrylic resin, or an imide resin. The base insulating layer 200-1 may have a single layer structure or a stacked structure stacked along the third direction DR3.

The base insulating layer 200-1 may be directly formed on the display panel 100 (refer to FIG. 2). Alternatively, the base insulating layer 200-1 may be a component of the display panel 100 (refer to FIG. 2). Alternatively, the base insulating layer 200-1 may be formed on a separate base layer, and the base layer may be coupled to each other through the display panel 100 (see FIG. 2) and an adhesive member.

Each of the first conductive layer 200-2 and the second conductive layer 200-4 may have a single-layer structure or may have a multilayer structure stacked along the third direction DR3. The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), and the like. In addition, the transparent conductive material may include a conductive polymer such as PEDOT, metal nanowires, graphene, and the like.

The multilayered conductive layer may include metal layers. The metal layers may have a three-layer structure of, for example, titanium/aluminum/titanium. The multilayered conductive layer may include at least one metal layer and at least one transparent conductive layer.

Each of the first conductive layer 200-2 and the second conductive layer 200-4 may include some of the first detection patterns 211, the first connection patterns 212, the second detection patterns 221, the second connection patterns 222, and the first and second detection lines 241 and 242.

For example, the first conductive layer 200-2 may include second connection patterns 222 and first and second detection lines 241 and 242. The second conductive layer 200-4 may include first detection patterns 211, second detection patterns 221, first connection patterns 212, first and second detection lines 241 and 242, and patterns 230.

The first and second detection lines 241 and 242 of the first conductive layer 200-2 and the first and second detection lines 241 and 242 of the second conductive layer 200-4 may be electrically connected to each other through a contact hole passing through the detection insulating layer 200-3. Accordingly, resistance of the first and second detection lines 241 and 242 may be reduced.

The first connection patterns 212 may be formed through the same process as the first detection patterns 211. Accordingly, the first connection patterns 212 and the first detection patterns 211 may include the same material and may have the same stacked structure. Further, the first connection patterns 212 and the first detection patterns 211 may have a single connected structure. The second connection patterns 222 may be disposed on a different layer from the second detection patterns 221. Accordingly, the second connection patterns 222 may be referred to as bridge patterns.

At least one of the detection insulating layer 200-3 and the cover insulating layer 200-5 may include an inorganic film. The inorganic film may include at least one of aluminum oxide, titanium oxide, silicon oxide silicon oxynitride, zirconium oxide, and hafnium oxide.

At least one of the detection insulating layer 200-3 and the cover insulation layer 200-5 may include an organic film. The organic film may include at least one of acrylic resin, methacrylic resin, polyisoprene vinyl resin, epoxy resin, urethane resin, cellulose resin, siloxane resin, polyimide resin, polyamide resin, and perylene resin.

Figure 7A:
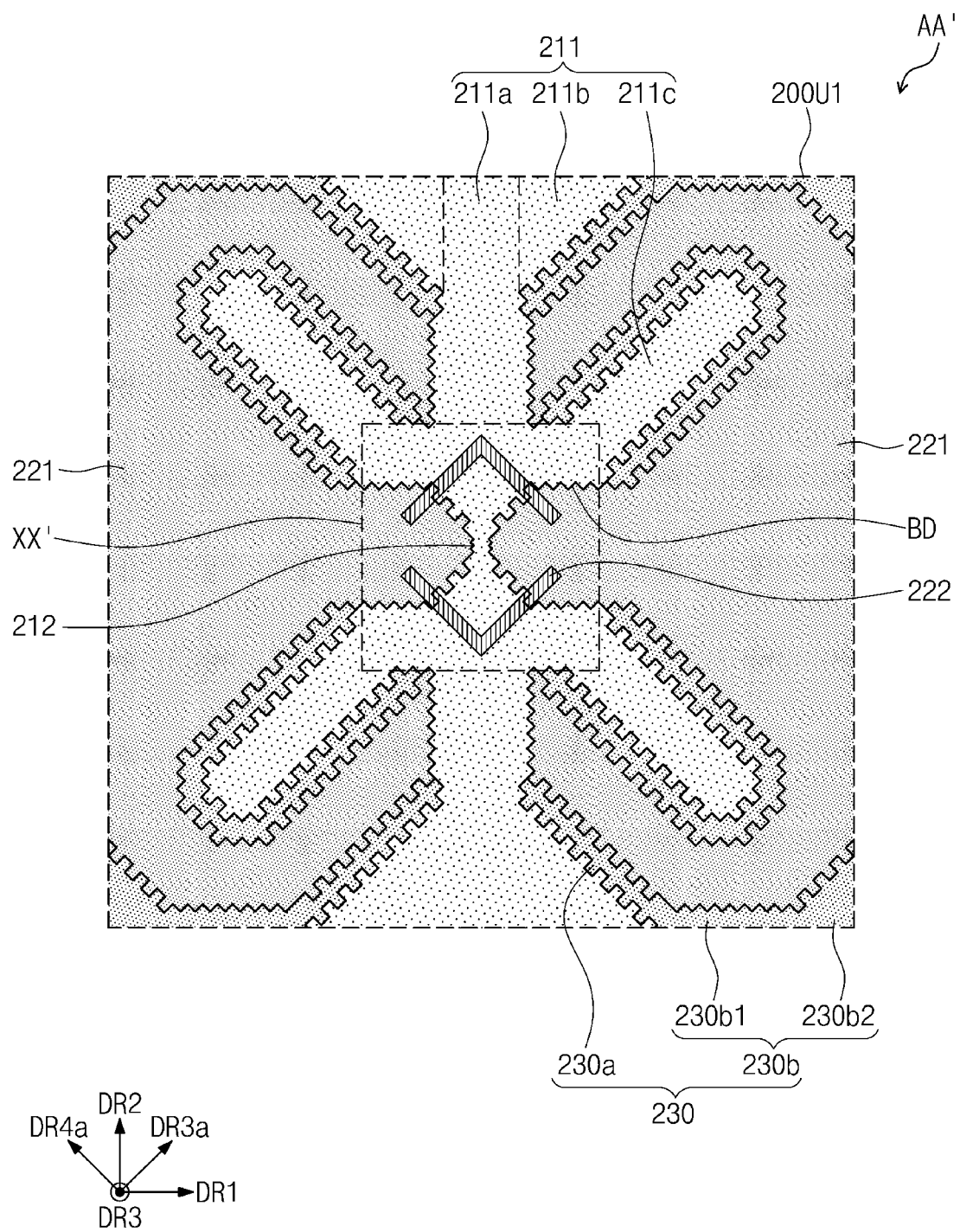
FIG. 7A is a plan view illustrating an enlarged area AA' of FIG. 4.
Figure 7B:
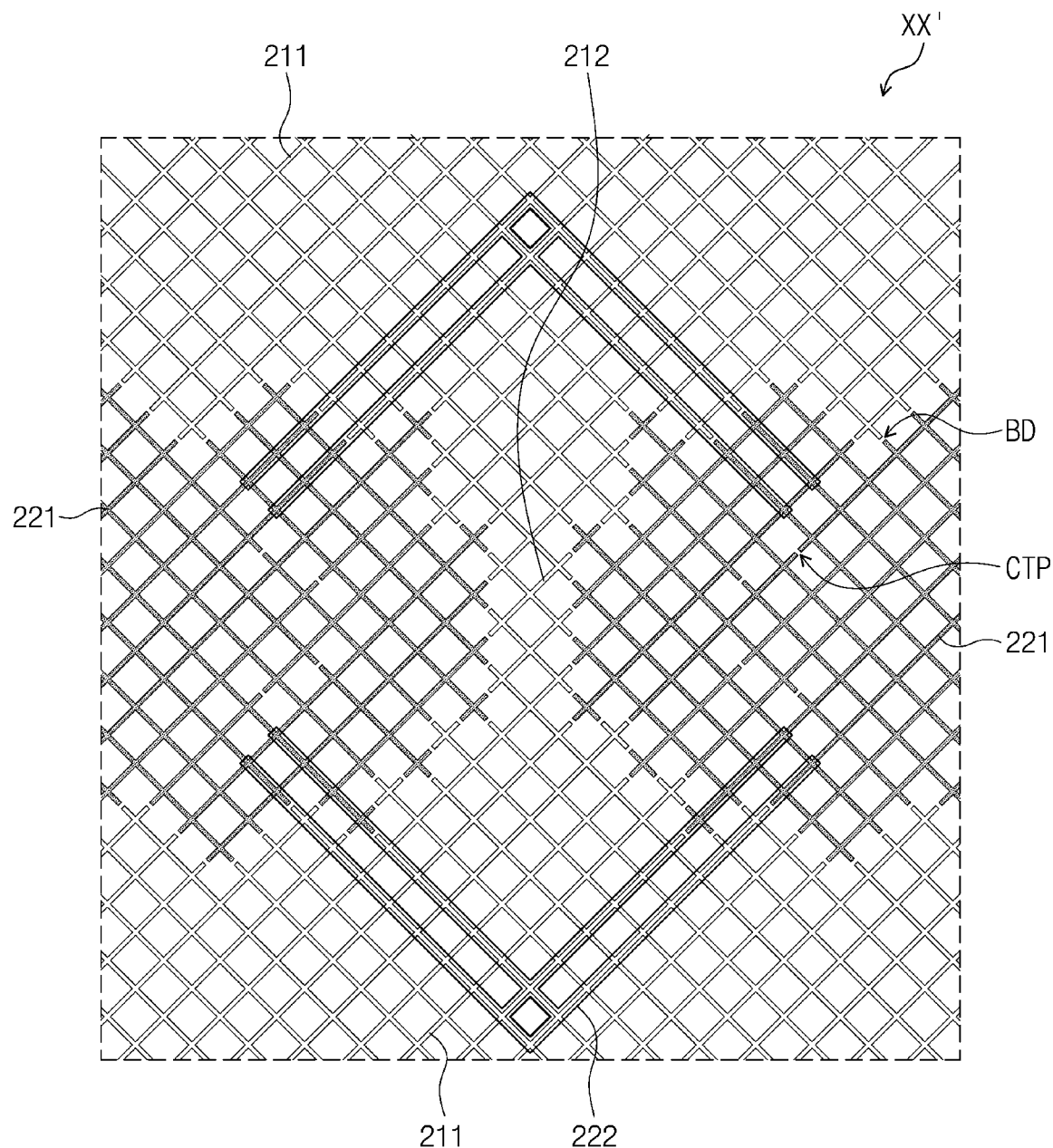
FIG. 7B is a plan view illustrating an enlarged area XX' of FIG. 7A.

FIG. 7A is a plan view illustrating an enlarged area AA' of FIG. 4. FIG. 7B is a plan view illustrating an enlarged area XX' of FIG. 7A.

7A and 7B, each of the first detection patterns 211, the second detection patterns 221, and the patterns 230 may have a mesh structure or a grid structure). The boundary BD between the first detection patterns 211, the second detection patterns 221, and the patterns 230 may be defined by removing a portion of the mesh structure. In FIG. 7A, the boundary is shown as a solid line to clearly show the boundary BD. A portion from which a portion of the mesh structures illustrated in FIG. 7B is removed may correspond to the boundary BD. Further, to prevent the boundary from being visually recognized, disconnection parts CTP from which portions of the mesh structures are removed may be additionally provided.

Referring to FIGS. 5, 7A, and 7B, the input sensor 200 may include a plurality of unit electrodes 200U. The plurality of unit electrodes 200U may be disposed in the active area 200A. Each of the plurality of unit electrodes 200U may include a portion of each of the two first detection patterns 211, a portion of each of the two second detection patterns 241, one first connection pattern 212, second connection patterns 222 crossing the one first connection pattern 212, and patterns 230. The unit electrodes 200U may include a first unit electrode, a second unit electrode, and a third unit electrode. The first to third unit electrodes will be described below.

Figure 8:
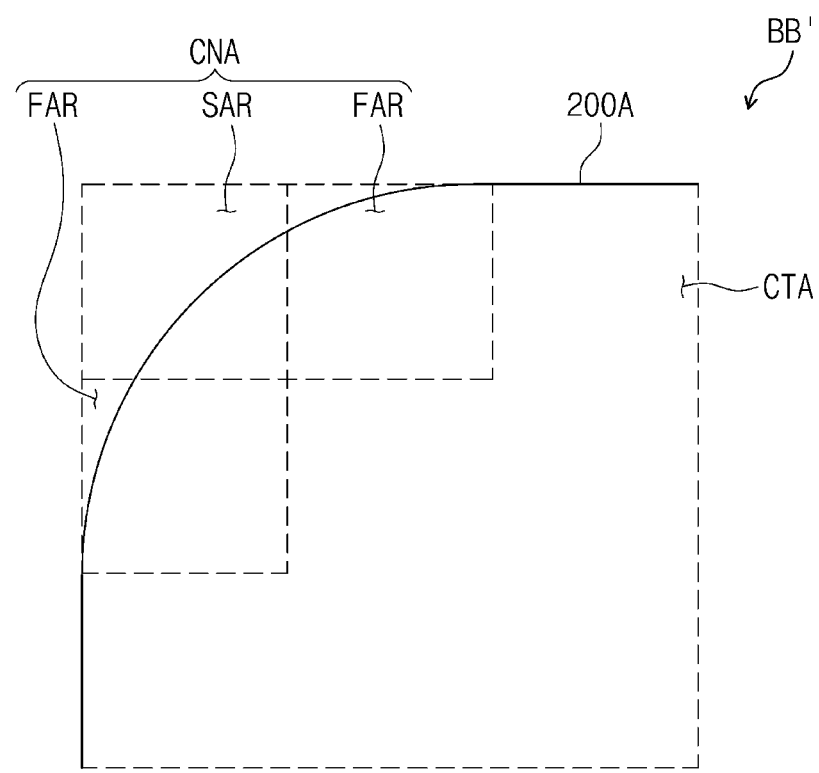
FIG. 8 is a plan view illustrating a corner area of the input sensor according to an embodiment of the inventive concept.

FIG. 8 is a plan view illustrating a corner area of the input sensor according to an embodiment of the inventive concept. FIG. 8 is a diagram illustrating an area BB' of FIG. 5.

Referring to FIG. 8, the input sensor 200 (refer to FIG. 5) may be divided into two areas. The input sensor 200 may include a center area CTA and a corner area CNA. The center area CTA may correspond to an area excluding the corner area CNA in the active area 200A of the input sensor 200. In FIG. 8, only the corner area CNA included in the BB' area is shown, but when referring to FIG. 5, the number of corner areas CNA of the input sensor 200 may be four arranged in the 3a direction DR3a and the 4a direction DR4a. In addition, only the center area CTA included in the area BB' is shown in FIG. 8, but when referring to FIG. 5, the center area CTA may be all areas other than the four corner areas CNA in the active area 200A.

In an embodiment, the corner area CNA may include a plurality of first areas FAR and a second area SAR disposed between the first areas FAR. The first areas FAR may be areas adjacent to the center area CTA in the first direction DR1 and the second direction DR2. The second area SAR corresponds to the outermost area in the 4a direction DR4a of the corner area CNA. For example, the second area SAR may be the outermost area of the input sensor 200.

Figure 9A:
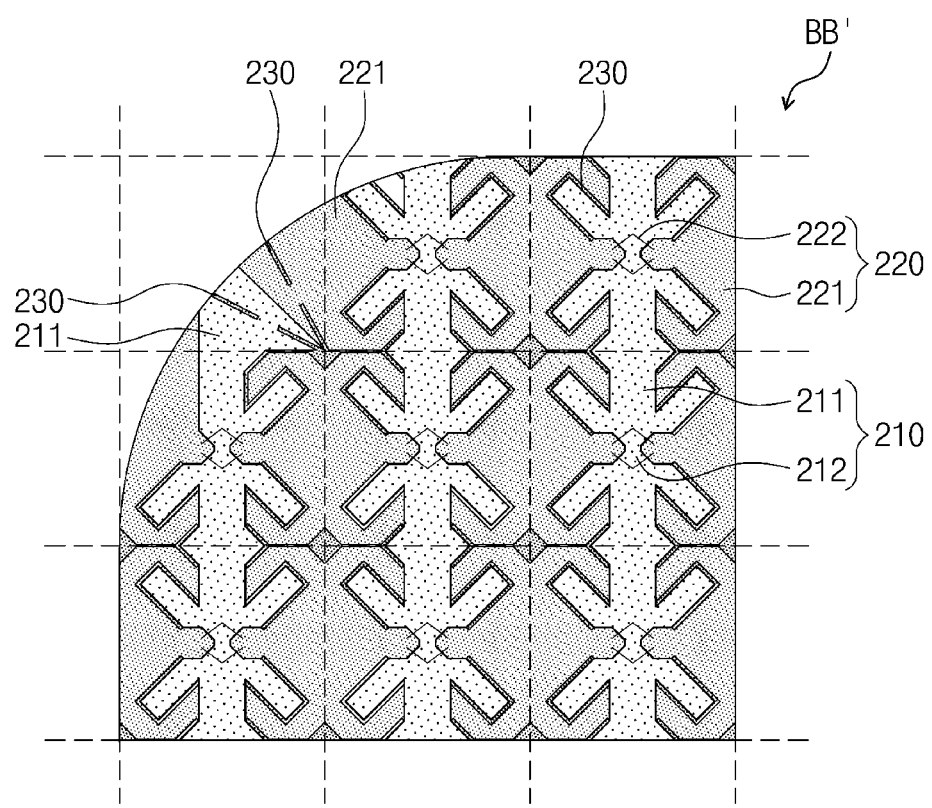
FIGS. 9A and 9B are plan views illustrating a second sensor part of an input sensor according to embodiment of the inventive concept.
Figure 9A:
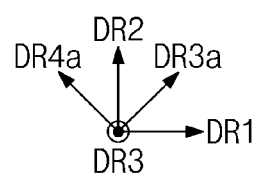
Figure 9B:
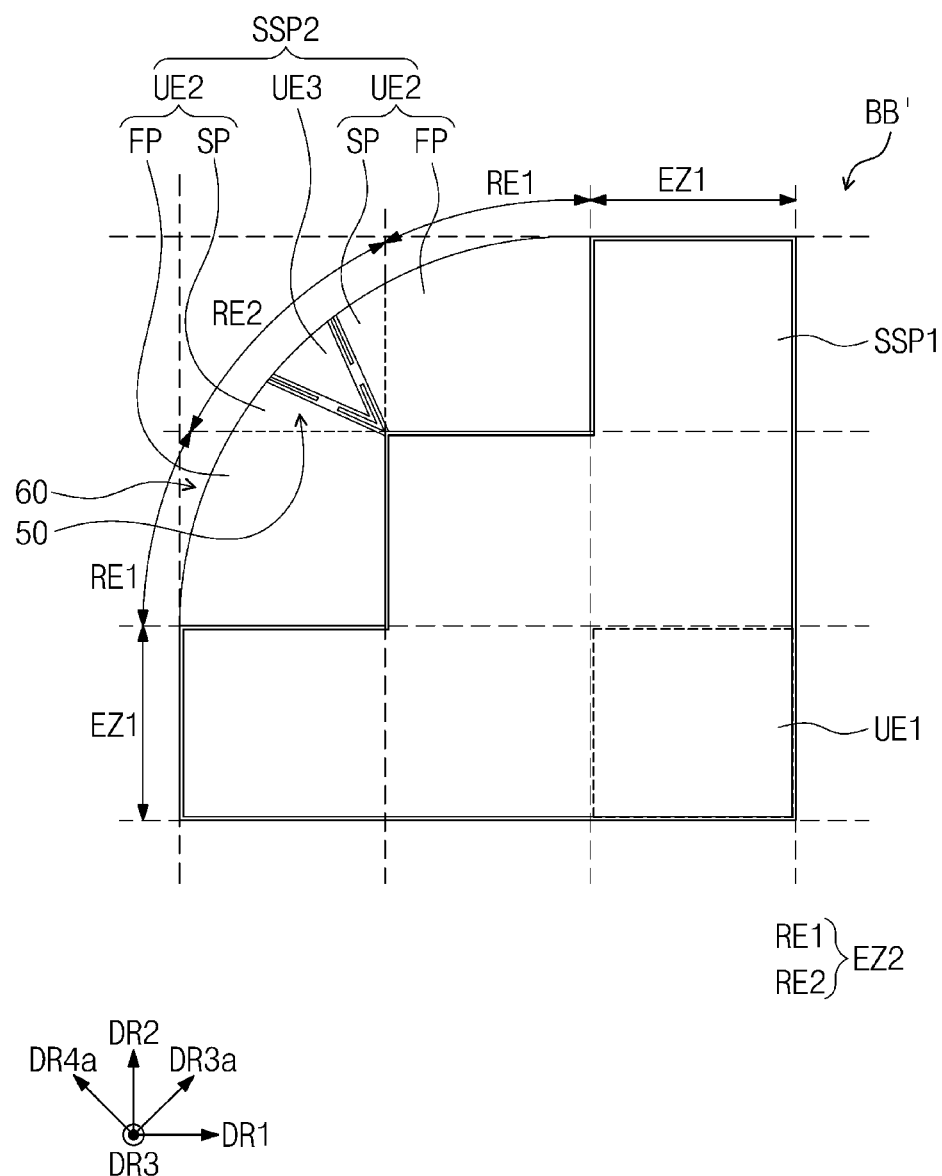

FIGS. 9A and 9B are plan views illustrating a second sensor part of an input sensor according to an embodiment of the inventive concept. FIG. 9A is a plan view illustrating an enlarged area BB' of FIG. 5. FIG. 9B is a diagram schematically showing FIG. 9A.

Referring to FIGS. 8, 9A, and 9B, the input sensor includes a first sensor part SSP1 and a second sensor part SSP2. The first sensor part SSP1 may be disposed in the center area CTA, and the second sensor part SSP2 may be disposed in the corner area CNA. The first sensor part SSP1 may include a plurality of first unit electrodes UE1. Each of the plurality of first unit electrodes UE1 may include a first detection electrode 210 and a second detection electrode 220 crossing each other. As described above, the first detection electrode 210 may include a first detection pattern 211 and a first connection pattern 212, and the second detection electrode 220 may include a second detection pattern 221 and a second connection pattern 222.

The second sensor part SSP may include a second unit electrode UE2 and a third unit electrode UE3. A plurality of second unit electrodes UE2 may be provided, and the third unit electrode UE3 may be disposed between the plurality of second unit electrodes UE2. Each of the second unit electrodes UE2 may include a first detection electrode 210 and a second detection electrode 220.

Each of the second unit electrodes UE2 may include a first part FP overlapping the first area FAR and a second part SP overlapping the second area SAR. The second part SP is extended from the first part FP.

In FIG. 9A, the plurality of second unit electrodes UE2 may include any one second unit electrode UE2 and another second unit electrode UE2.

The second part SP of any one second unit electrode UE2 may be that the second detection pattern 221 included in the first part FP of the first area FAR is extended to the second area SAR. For example, the second part SP may correspond to the second detection pattern 221 of the second unit electrode UE2 overlapping the second area SAR.

The second part SP of the other second unit electrode UE2 may be that the first detection pattern 211 included in the first part FP of the first area FAR is extended to the second area SAR. For example, the second part SP may correspond to the second detection pattern 211 of the second unit electrode UE2 overlapping the second area SAR.

In an embodiment, an area of each of the second unit electrodes UE2 may be the same as an area of each of the first unit electrodes UE1. Referring to FIGS. 5 and 9B, the area 60 of the peripheral area 200N disposed in the first area FAR may be the same as the area of the second part SP disposed in the second area SAR. Therefore, the area of each of the second unit electrodes UE2 may be the same as the area of each of the first unit electrodes UE1. Therefore, the area of the first part FP in each of the second unit electrodes UE2 may be smaller than the area of each of the first unit electrodes UE1.

The third unit electrode UE3 may be disposed in the second area SAR. The third unit electrode UE3 may overlap a portion of the second area SAR. The third unit electrode UE3 may overlap another portion of the second area SAR except for a portion overlapping the second unit electrodes UE2. The third unit electrode UE3 may include a first detection pattern 211 and a second detection pattern 221. The area of the third unit electrode UE3 may be the same as the area of each of the second parts SP. The area of the third unit electrode UE3 may be 1/10 of the area of the second unit electrode UE2. For example, the area of the second unit electrode UE2 may correspond to 10 times the area of the third unit electrode UE3. For example, when assuming that the area of the first unit electrode UE1 is 100, the area of the second unit electrode UE2 is equal to the area of the first unit electrode UE1 and thus is 100. The area of the third unit electrode UE3 is 10 because it is 1/10 of the second unit electrode UE2. When assuming that the area of the first part FP of the second unit electrode UE2 is 90 and the area of the second part SP is 10, the area of the third unit electrode UE3 may be the same as the area of the second part SP.

A pattern 230 may be disposed on the boundary between the second unit electrodes UE2 and the third unit electrode UE3. For example, the pattern 230 may include a dummy pattern.

In an embodiment, the first edge EZ1, which is an edge of the active area 200A of the input sensor 200 included in the first sensor part SSP1, may have a linear shape. The second edge EZ2, which is an edge of the active area 200A of the input sensor included in the second sensor part SSP2, may have a curved shape. The second edge EZ includes a first round edge RE1 and a second round edge RE2. The first round edge RE1 corresponds to the edge of the plurality of second unit electrodes UE2, and the second round edge RE2 corresponds to the edge of the third unit electrode UE3. In an embodiment, the curvature of the second round edges RE2 is greater than the curvature of the first round edges RE1.

FIG. 9A is a detailed illustration of a structure of each of the second unit electrodes UE2 equal to the area of each of the first unit electrodes UE1 of FIG. 9B, and this corresponds to an embodiment of the inventive concept, and the structure of the second unit electrodes UE2 and the third unit electrode UE3 of the inventive concept is not necessarily limited thereto.

Figure 10A:
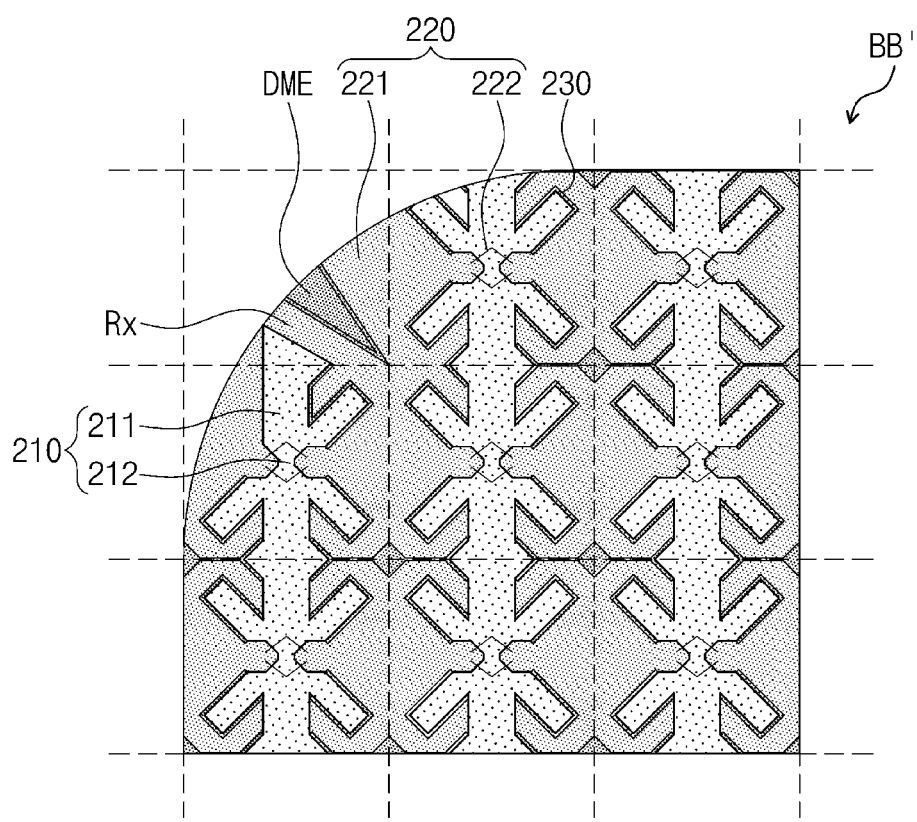
FIGS. 10A and 10B are plan views illustrating a second sensor part of an input sensor according to an embodiment of the inventive concept.
Figure 10A:
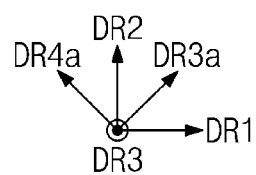
Figure 10B:
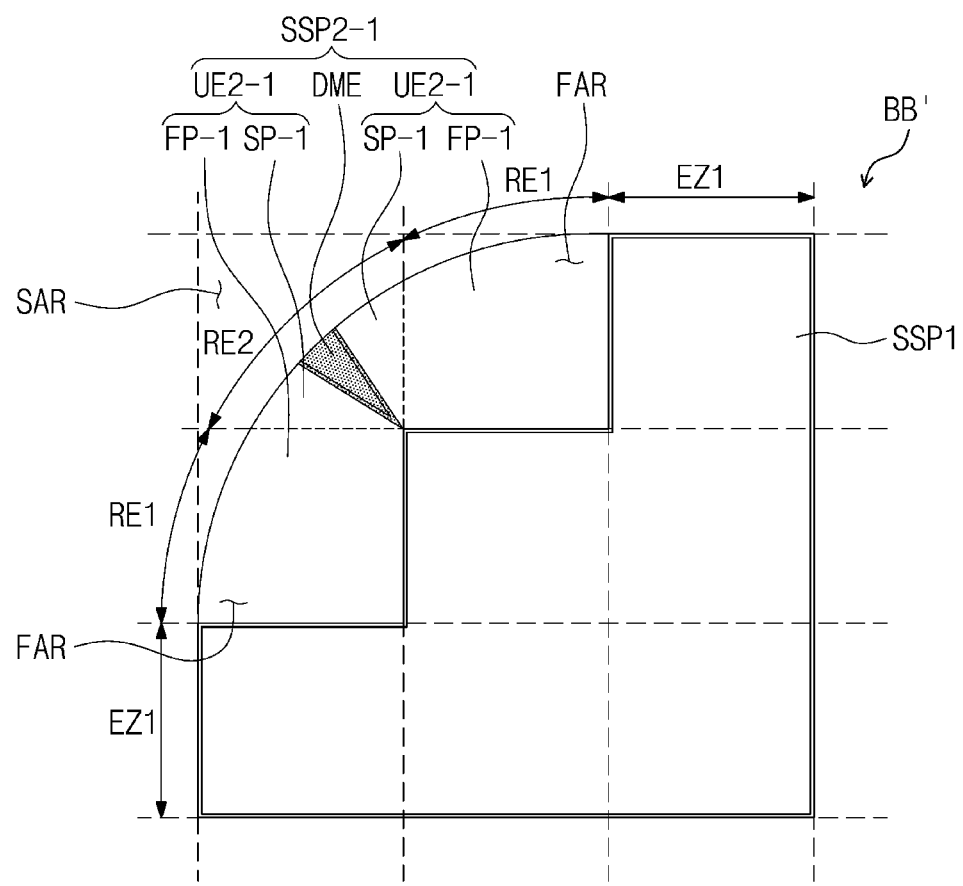

FIGS. 10A and 10B are plan views illustrating a second sensor part of an input sensor according to an embodiment of the inventive concept. FIG. 10A is a plan view illustrating an enlarged area BB' of FIG. 5. FIG. 10B is a diagram schematically showing FIG. 10A. In relation to FIGS. 10A and 10B, to the extent that details concerning an element have been omitted, it may be assumed that the omitted details are at least similar to corresponding elements that are described elsewhere herein.

Referring to FIGS. 8, 10A, and 10B, the third unit electrode UE3 (refer to FIG. 9A) may include a dummy electrode DME. The dummy electrode DME may be a floating electrode. The area of the dummy electrode DME may be smaller than the area of the second part SP-1. In this embodiment, an area of each of the second unit electrodes UE2-1 may be larger than an area of each of the first unit electrodes UE1 (refer to FIG. 9A). For example, if the area of the first pan SP1-1 is 90 and the area of the second part SP2-1 is 13, an area of each, of the second unit electrodes UE2-1 may be 103, and an area of each of the first unit electrodes UE1 may be greater than 100. The dummy electrode DME disposed in the second area SAR that is the outermost area of the input sensor 200 (refer to FIG. 5) does not detect an input. According to an embodiment of the inventive concept, as the area of the second unit electrodes UE2 disposed in the first areas FAR adjacent to the outermost area is increased, ultimately, the sensitivity of the corner area CNA to detect a touch may be increased. In addition, according to an embodiment of the inventive concept, an input error occurring in the corner area CNA may be prevented by omitting the detection electrode from the second area SAR that is the outermost area.

The area of each of the second unit electrodes UE2 of FIG. 10A is larger than the area of the first unit electrodes UE1, but the structure of the second unit electrodes UE2 is not necessarily limited to what is shown in FIG. 10A.

Figure 11A:
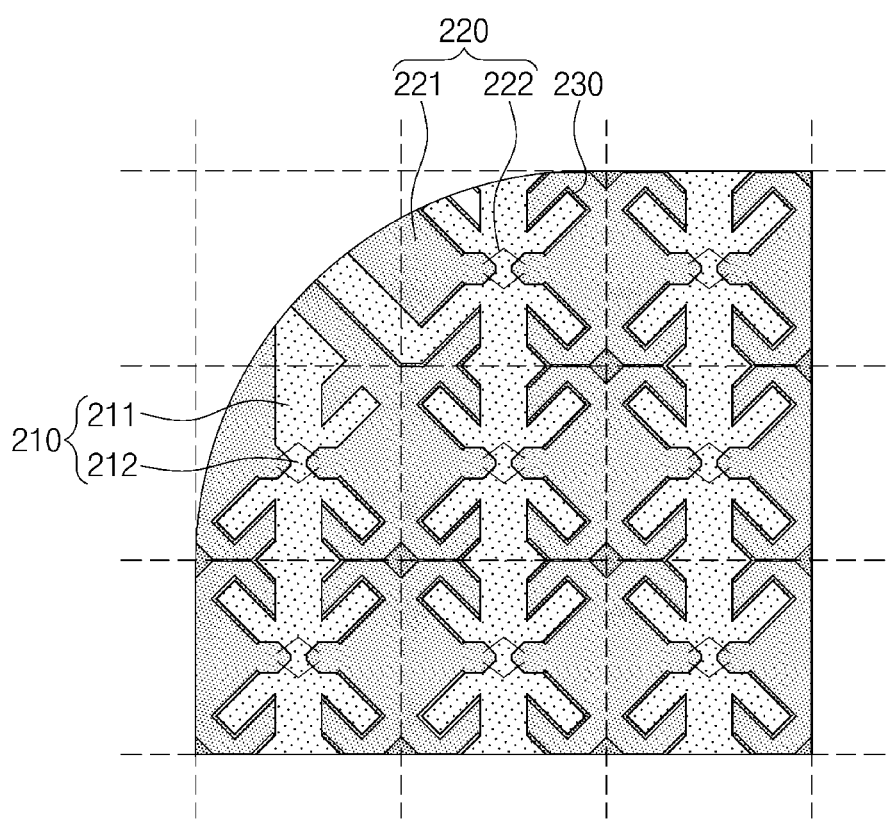
FIGS. 11A and 11B are plan views illustrating a second sensor part of an input sensor according to an embodiment of the inventive concept.
Figure 11B:
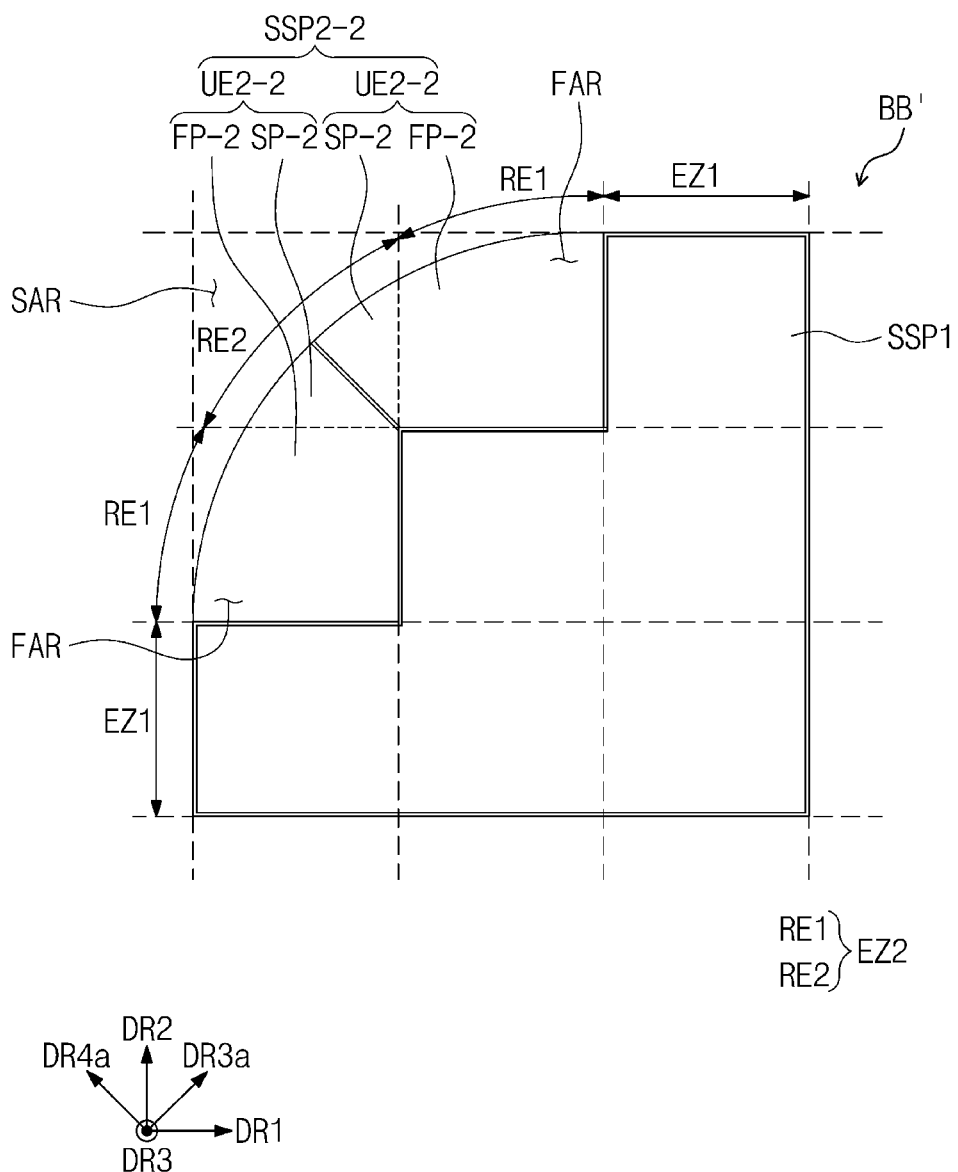

FIGS. 11A and 11B are plan views illustrating a second sensor part of an input sensor according to an embodiment of the inventive concept. FIG. 11A is a plan view illustrating an enlarged area BB' of FIG. 5. FIG. 11B is a diagram schematically showing the arrangement of FIG. 11A. In relation to FIGS. 11A and 11B, to the extent that details concerning an element have been omitted, it may be assumed that the omitted details are at least similar to corresponding elements that are described elsewhere herein.

Referring to FIGS. 8, 11A, and 11B, the second area SAR does not have its own detection electrodes and so the electrodes that are present within this section extend into this section from adjacent sections. In an embodiment, the plurality of second detection electrodes UE2-2, may be disposed in the first areas FAR. Each of the second detection electrodes UE2-2 may include a first part FP-2 disposed in each of the first areas FAR and a second part extending from the first part FP-2 to the second area SAR. The second parts SP-2 of the second detection electrodes UE2-2 are disposed adjacent to each other the second area SAR. The second parts SP2-2 are not electrically connected to each other. The second part SP2-2 includes a first detection pad 211 and a second detection pad 221. The first detection pad 211 and the second detection pad 221 may be extended in the first part FP-2 disposed in the first area FAR. For example, in the present embodiment, the area of each of the second unit electrodes UE2-2 is larger than the area of each of the first unit electrodes UE1. Areas of each of the second unit electrodes UE2-2 may be the same. In this embodiment, the area of the second unit electrode UE2-2 of the second area SAR adjacent to the first area FAR, which is the outermost area, is maximized to the outermost area, and does not arrange the detection electrode in the outermost area. Accordingly, the inventive concept may increase the sensitivity of the corner area CNA and prevent an input error.

An embodiment of the inventive concept is to reduce or remove the area of the detection electrode disposed at the outermost of the corner area and increase the area of the adjacent detection electrodes so that sensitivity of corner area may be increased.

Although embodiments of the inventive concept have been described, it is understood that the inventive concept should not necessarily be limited to these embodiments but various changes and modifications may be made by one ordinary skilled in the art within the spirit and scope of the present disclosure.

What is claimed is:

1. A display device, comprising:
a window;
a display panel disposed under the window; and
an input sensor disposed between the window and the display panel and having a center area and a corner area disposed outside of the center area,
wherein the input sensor comprises a first sensor part disposed in the center area and a second sensor part disposed in the corner area,
wherein the first sensor part comprises a plurality of first unit electrodes,
wherein the second sensor part comprises:
a plurality of second unit electrodes, each of which including a first part overlapping a first area and a second part extending from the first part and overlapping a first portion of a second area adjacent to the first area; and
a third unit electrode overlapping a second portion of the second area that is mutually exclusive with respect to the first portion of the second area,
wherein an area of each of the second unit electrodes is equal to or greater than an area of each of the first unit electrodes,
wherein the third unit electrode is disposed between two second unit electrodes of the plurality of second unit electrodes, and
wherein the two second unit electrodes are symmetrical with respect to a center line of the third unit electrode.

2. The display device of claim 1, wherein a first edge that is an edge of the first sensor part has a linear shape, and a second edge that is an edge of the second sensor part has a curved shape.

3. The display device of claim 2, wherein the second edge comprises a first round edge included in each of the second unit electrodes and a second round edge included in the third unit electrode, and a curvature of the second round edge is greater than that of the first round edge.

4. The display device of claim 1, wherein each of the first unit electrodes comprises a first detection electrode and a second detection electrode crossing the first detection electrode.

5. The display device of claim 1, wherein each of the second unit electrodes comprises a first detection electrode and a second detection electrode crossing the first detection electrode.

6. The display device of claim 5, wherein the first detection electrode comprises a first detection pattern, and a first connection pattern connected to the first detection pattern and disposed on a same layer as the first detection pattern, wherein the second detection electrode comprises a second detection pattern disposed on a same layer as the first detection pattern, and a second connection pattern disposed on a layer different from the first connection pattern and connected to the second detection pattern.

7. The display device of claim 6, wherein the third unit electrode comprises the first detection pattern and the second detection pattern.

8. The display device of claim 7, wherein when the area of each of the second unit electrodes is equal to the area of each of the first unit electrodes, a shape of each of the second unit electrodes is different from a shape of each of the first unit electrodes.

9. The display device of claim 5, wherein the area of each of the second unit electrodes is substantially 10 times greater than an area of the third unit electrode.

10. The display device of claim 5, wherein an area of the second part of each of the second unit electrodes is substantially equal to an area of the third unit electrode.

11. The display device of claim 1, wherein an area of the first part of each of the second unit electrodes is smaller than the area of each of the first unit electrodes.

12. The display device of claim 1, wherein each of the second unit electrodes comprises a first detection electrode and a second detection electrode crossing the first detection electrode, and the third unit electrode comprises a dummy electrode.

13. The display device of claim 12, wherein the area of each of the second unit electrodes is larger than the area of each of the first unit electrodes.

14. The display device of claim 12, wherein an area of the dummy electrode is smaller than an area of the second, part of each of the second unit electrodes.

15. A display device, comprising:
a window;
a display panel disposed under the window; and
an input sensor disposed between the window and the display panel, and having a center area and a corner area disposed outside the center area, the corner area including a plurality of first areas adjacent to the center area and a second area disposed between each of the plurality of first areas,
wherein the input sensor comprises a first sensor part disposed in the center area and a second sensor part disposed in the corner area,
wherein the first sensor part comprises a plurality of first unit electrodes,
wherein the second sensor part comprises a plurality of second unit electrodes overlapping the plurality of first areas, respectively, and overlapping a first portion and a second portion of the second area, respectively,
wherein the plurality of second unit electrodes are symmetrical with respect to a center line of the second area, and wherein an area of each of plurality of second unit electrodes is larger than an area of each of the first unit electrodes.

16. The display device of claim 15, wherein each of the plurality of second unit electrodes comprises a first part respectively disposed in each of the first areas and a second part partially extended from the first part to the second area, and wherein the plurality of second unit electrodes directly face each other in the second area.

17. The display device of claim 15, wherein a first edge that is an edge of the first sensor part has a linear shape, and a second edge that is an edge of the second sensor part has, a curved shape.

18. The display device of claim 15, wherein each of the first unit electrodes and the plurality of second unit electrodes comprise a first detection electrode and a second detection electrode crossing the first detection electrode.

19. The display device of claim 16 wherein areas of each of the plurality of second unit electrodes are the same.

20. A display device, comprising:
a window;
a display panel having a straight central region and curved edges; and
an input sensor disposed between the window and the display panel, the input sensor comprising a first sensor part corresponding with the straight central region of the display panel and a second sensor part corresponding with the curved edges of the display panel,
wherein the first sensor part comprises a plurality of rectangular first unit electrodes,
wherein the second sensor part comprises a first-second unit electrode having at least one rounded corner, a second-second unit electrode having at least one rounded corner, and a third unit electrode having a wedge shape and disposed between the first-second unit electrode and the second-second unit electrode, and
wherein the first-second unit electrode and the second-second unit electrode are symmetrical with respect to a center line of the third unit electrode.

21. The display device of claim 20, wherein an area of each of the first and second-second unit electrodes is greater than or equal to an area of each of the first unit electrodes.

22. The display device of claim 20, wherein each of the first unit electrodes, each of the first and second-second unit electrodes, and the third unit electrode includes a first detection electrode and a second detection electrode crossing the first detection electrode.

23. The display device of claim 20, wherein an area of the third unit electrode is smaller than an area of each of the first unit electrodes and each of the first-second unit electrode and the second-second unit electrode.

* * * * *